US010770041B2

(12) United States Patent
Koizumi et al.

(10) Patent No.: US 10,770,041 B2
(45) Date of Patent: Sep. 8, 2020

(54) KICK PAD

(71) Applicant: Pearl Musical Instrument Co., Yachiyo-shi (JP)

(72) Inventors: Takashi Koizumi, Yachiyo (JP); Yuichi Sato, Chiba (JP); Akito Takegawa, Yachiyo (JP)

(73) Assignee: Pearl Musical Instrument Co., Yachiyo-shi (JP)

( * ) Notice: Subject to any disclaimer, the term of this patent is extended or adjusted under 35 U.S.C. 154(b) by 0 days.

(21) Appl. No.: 16/242,301

(22) Filed: Jan. 8, 2019

(65) Prior Publication Data

US 2019/0213984 A1 Jul. 11, 2019

(30) Foreign Application Priority Data

Jan. 9, 2018 (JP) ................................ 2018-001166

(51) Int. Cl.

| | |
|---|---|
| ***G10D 13/02*** | (2020.01) |
| ***G10H 3/14*** | (2006.01) |
| ***H01L 41/04*** | (2006.01) |
| ***G10D 13/10*** | (2020.01) |
| ***G10D 13/11*** | (2020.01) |

(52) U.S. Cl.

CPC ............ *G10D 13/02* (2013.01); *G10D 13/11* (2020.02); *G10D 13/26* (2020.02); *G10H 3/146* (2013.01); *H01L 41/04* (2013.01)

(58) Field of Classification Search

CPC .... G10D 13/024; G10D 13/006; H01L 41/04; G10H 3/146; G10H 2230/291; G10H 2220/525; G10H 1/32

USPC ........................................................ 84/411 R

See application file for complete search history.

(56) References Cited

U.S. PATENT DOCUMENTS

| | | | | |
|---|---|---|---|---|
| 4,984,498 A * | 1/1991 | Fishman | .............. | G10D 13/024 29/594 |
| 5,293,000 A * | 3/1994 | Adinolfi | .............. | G10D 13/024 84/730 |
| 2012/0000345 A1* | 1/2012 | Mori | .................... | G10D 13/006 84/422.1 |

FOREIGN PATENT DOCUMENTS

JP 2007-206633 A 8/2007

OTHER PUBLICATIONS

U.S. Appl. No. 16/242,426, filed Jan. 8, 2019, Akito Takegawa.

* cited by examiner

*Primary Examiner* — Jeffrey Donels

(74) *Attorney, Agent, or Firm* — Harness, Dickey & Pierce, P.L.C.

(57) ABSTRACT

A kick pad includes a piezoelectric element (1) that converts a vibration generated by beating with a beater into an electric signal and outputs the electric signal, an impact-absorbing member (5) arranged between the piezoelectric element (1) and a surface (21*a*) to be beaten by the beater, and a sheet-like striking surface cover (21) that includes a front surface including the surface (21*a*) to be beaten, and that wraps the impact-absorbing member (5), together with the piezoelectric element (1), on a back surface side of the striking surface cover (21).

9 Claims, 4 Drawing Sheets

KICK PAD

CROSS-REFERENCE TO RELATED APPLICATIONS

This application is based upon and claims the benefit of priority from Japanese Patent Application No. 2018-001166, filed Jan. 9, 2018; the entire contents of which are incorporated herein by reference.

BACKGROUND

1. Field

The present invention relates to, for example, a kick pad of an electronic drum.

2. Description of the Related Art

A kick pad of an electronic drum is mounted on a stand, for example, when used. A foot pedal is fixed to a lower end of the stand. When such an electronic drum is played, the foot pedal is operated with the foot, causing the beater to be struck against the kick pad. The stand and/or the foot pedal includes a stopper pin. The stopper pin is stuck in a vibration-proof mat put on a floor to prevent slipping.

With a conventional kick pad, it is difficult to obtain a natural rebound as can be obtained by an acoustic drum when the kick pad is beaten with a beater. In addition, with the conventional kick pad, when the intensity of striking of the beater is slightly varied by depressing the foot pedal with a subtly different intensity, it is difficult to output such a subtle difference as an intensity of sound.

SUMMARY

It is an object of the present invention to provide a kick pad capable of obtaining a natural rebound and delicately expressing the intensity of sound.

To achieve the above-described object, the kick pad according to an embodiment of the present invention includes: a piezoelectric element that converts a vibration generated by beating with a beater into an electric signal and outputs the electric signal; an impact-absorbing member arranged between the piezoelectric element and a surface to be beaten by the beater; and a sheet-like striking surface cover that includes a front surface including the surface to be beaten, and that wraps the impact-absorbing member, together with the piezoelectric element, on a back surface side of the striking surface cover.

By using the kick pad according to the embodiment of the present invention, it is possible to obtain a natural rebound, and to delicately express the intensity of sound.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION

Hereinafter, an embodiment of the present invention will be described with reference to the accompanying drawings.

Figure 1:
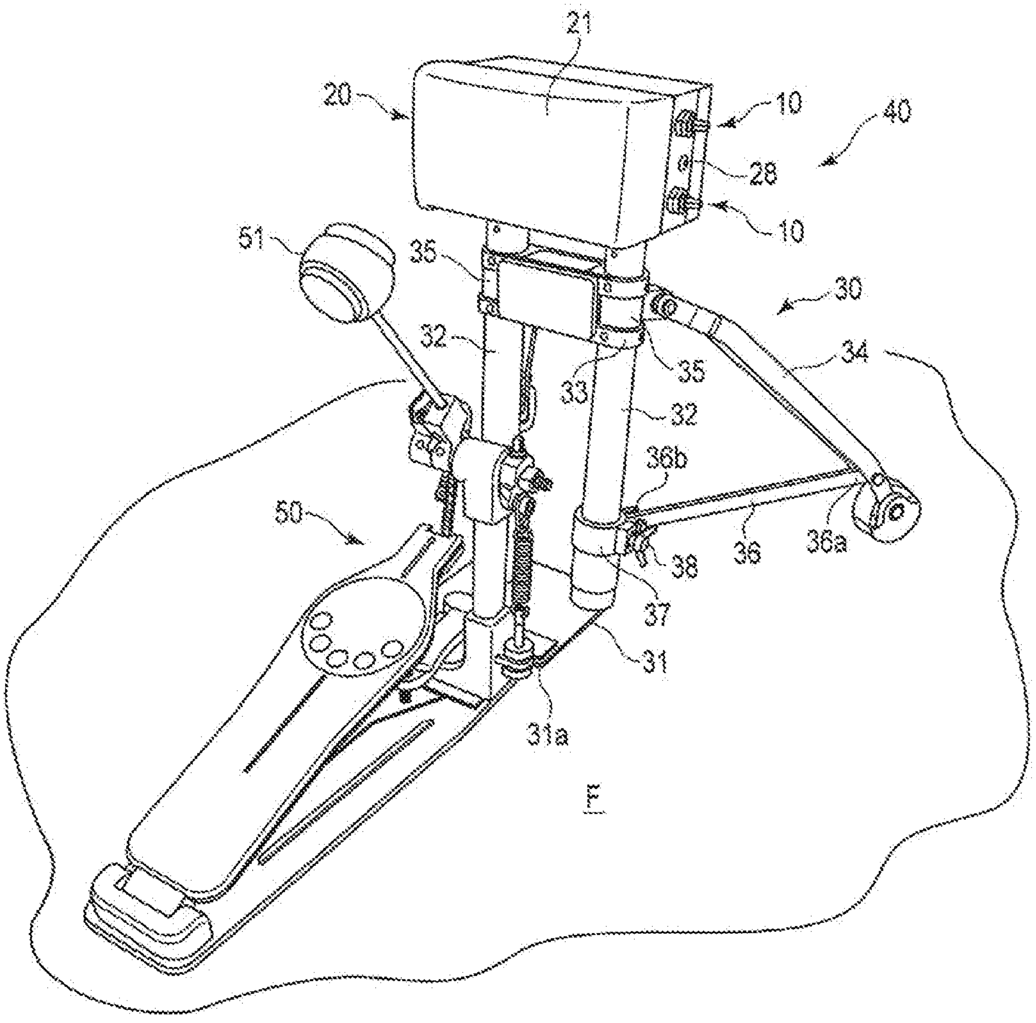
FIG. 1 is an external perspective view showing an assembly in which a kick pad is mounted on a stand, according to an embodiment.

FIG. 1 is an external perspective view showing an assembly 40 in which a kick pad 20 is mounted on a stand 30 via four supporters 10. FIG. 1 shows a state in which a foot pedal 50 is mounted on a bottom plate 31 of the stand 30. A front surface of the kick pad 20 corresponds to a head of a bass drum of an acoustic drum, and the bottom plate 31 of the stand corresponds to a hoop of the bass drum.

In the description that follows, the direction in which the assembly 40 faces the foot pedal 50 will be referred to as a front side (or an anterior side) as viewed from the player, and the direction in which a beater 51 beats the kick pad 20 will be referred to as a back side (or a rear side). Since matters such as the configuration of the foot pedal 50 and the method of mounting the foot pedal 50 on the bottom plate 31 are well-known in the art, a detailed description of such matters will be omitted herein.

The stand 30 includes the bottom plate 31, which is formed of a substantially rectangular metal plate and on which the foot pedal 50 is mounted. The bottom plate 31 is arranged in parallel to a floor surface F, and respectively fixes lower ends of two main frames 32 to two corner portions on the back side of the upper surface of the bottom plate 31. The foot pedal 50 is attached to an edge portion **31*a* on the front side of the bottom plate 31, which is distanced from the lower ends of the main frames 32**.

The two main frames 32 are formed of, for example, metal pipes, and extend upward from the bottom plate 31 substantially parallel to each other. The kick pad 20, which will be described later, is attached to upper ends of the two main frames 32.

A sub frame 33 is bridged between the two main frames 32. The sub frame 33 is formed of, for example, a metal plate. Supporting frames 34 are respectively provided on the back side of the main frames 32. Each of the supporting frames 34 has a configuration in which two elongated plates are joined at both ends thereof. Each of the supporting frames 34 is provided in such a manner that its upper end is rotatable around the corresponding main frame 32 via a rotatable sleeve 35, at a position where the sub frame 33 is connected.

At a lower end of each of the supporting frames 34, a stopper pin (not shown in the drawings), which is stuck in a vibration-proof mat (not shown in the drawings) put on the floor surface F and which is designed to prevent movement of the stand 30, is provided so as to be protrudable therefrom. A beam frame 36 is provided between a lower end of each of the supporting frames 34 and a lower end of the corresponding main frame 32. One end **36*a* of the beam frame 36 is rotatably attached to the supporting frame 34. A slidable sleeve 37 is rotatably attached to the other end 36*b*** of the beam frame 36. The slidable sleeve 37 is attached so as to be slidable and rotatable around the main frame 32.

When the slidable sleeve 37 is slid upward along the main frame 32 from the state shown in FIG. 1, to make the other end 36*b* of the beam frame 36 close to an upper end of the supporting frame 34, the supporting frame 34 and the beam frame 36 will be made close to the state of being parallel to the main frame 32. That is, when the slidable sleeve 37 is slid to a position closest to the rotatable sleeve 35, the supporting frame 34 and the beam frame 36 will be substantially parallel to the main frame 32, and the stand 30 will be folded back.

When the stand 30 is unfolded to the state shown in FIG. 1 for use, a winged screw 38 is threadably fastened into the screw hole that penetrates the slidable sleeve 37, and the slidable sleeve 37 is fixed close to the lower end of the main frame 32. Thereby, the supporting frame 34 is fixed in an open state as shown in the drawing, and the stand 30 is stabilized. At this time, by changing the fixed position of the slidable sleeve 37 with respect to the main frame 32, the angle of the supporting frame 34 can be adjusted, thus allowing the tilt angle of the main frame 32 to be adjusted. That is, the angle at which the kick pad 20 is supported may be varied, as in the case of tilting a bass drum of an acoustic drum.

The two supporting frames 34 respectively connected to the two main frames 32 have a configuration capable of adjusting the opening angle as viewed in a direction distant from each other. That is, by rotating the rotatable sleeve 35 relative to the main frame 32 and rotating the slidable sleeve 37 relative to the main frame 32, the supporting frame 34 and the beam frame 36 can be rotated relative to the main frame 32, and the angle of the supporting frame 34 can be adjusted. This facilitates installation of the assembly 40 in a small space around the player's feet, thereby increasing the flexibility in layout. The angle-adjusted supporting frame 34 is fixed to the adjusted angle when the winged screw 38 is fastened.

Figure 2:
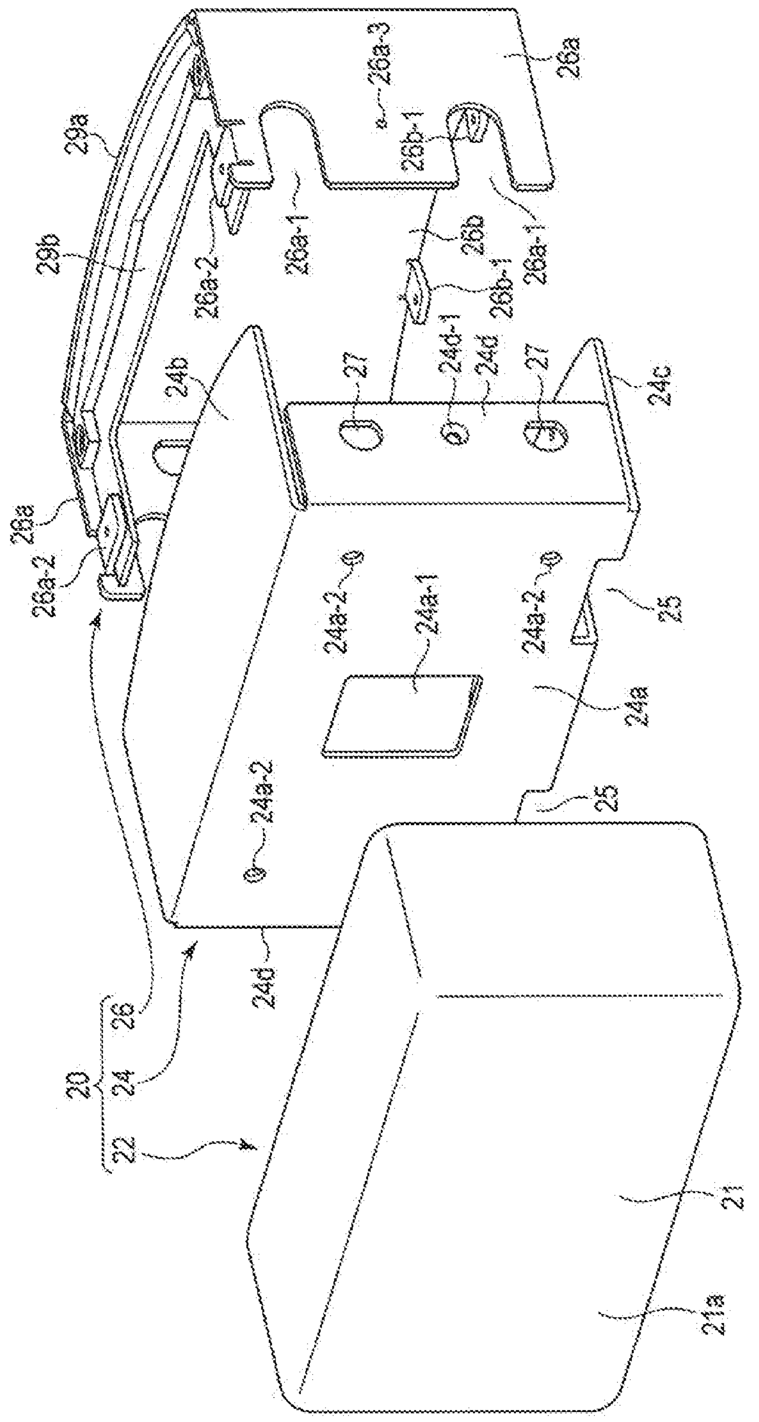
FIG. 2 is an exploded perspective view of the kick pad shown in FIG. 1.
Figure 3:
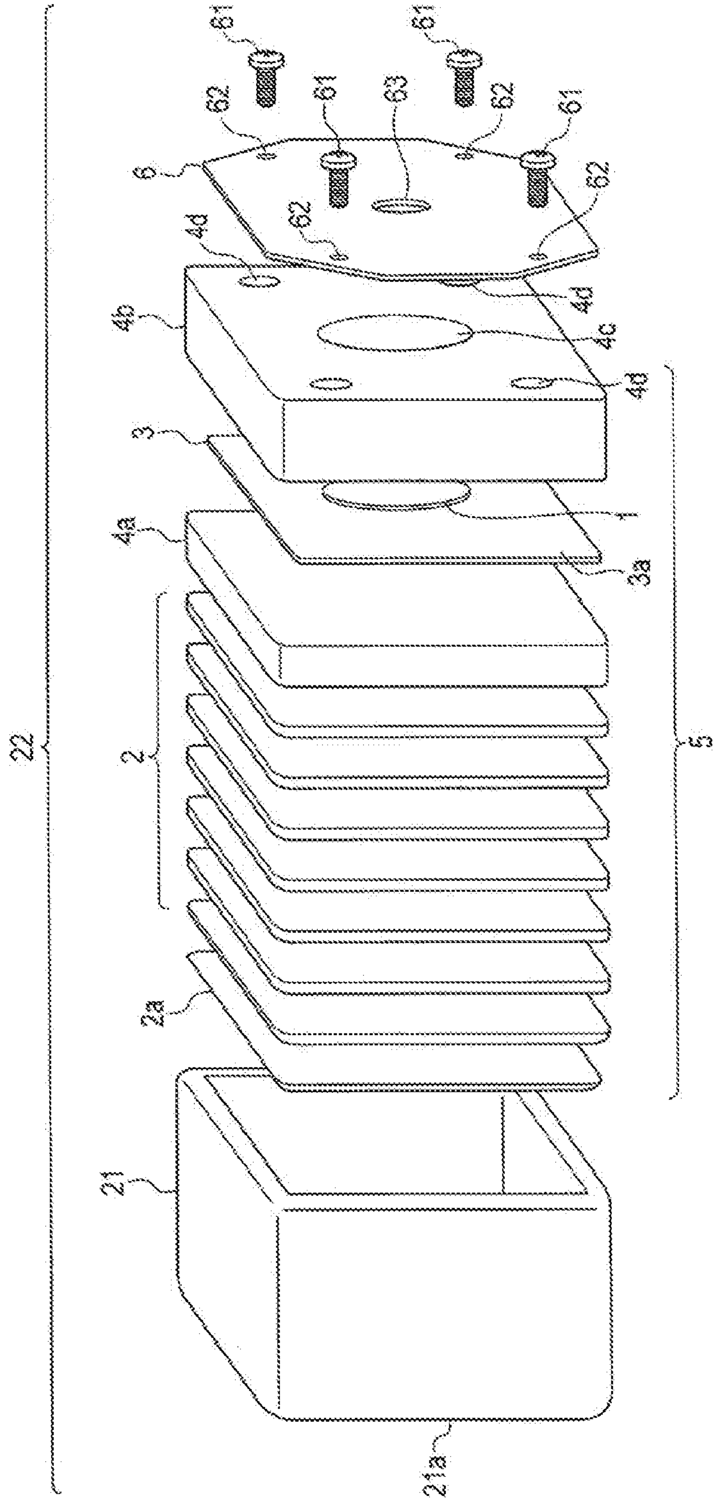
FIG. 3 is an exploded perspective view of a pad main body of the kick pad shown in FIG. 2.
Figure 4:
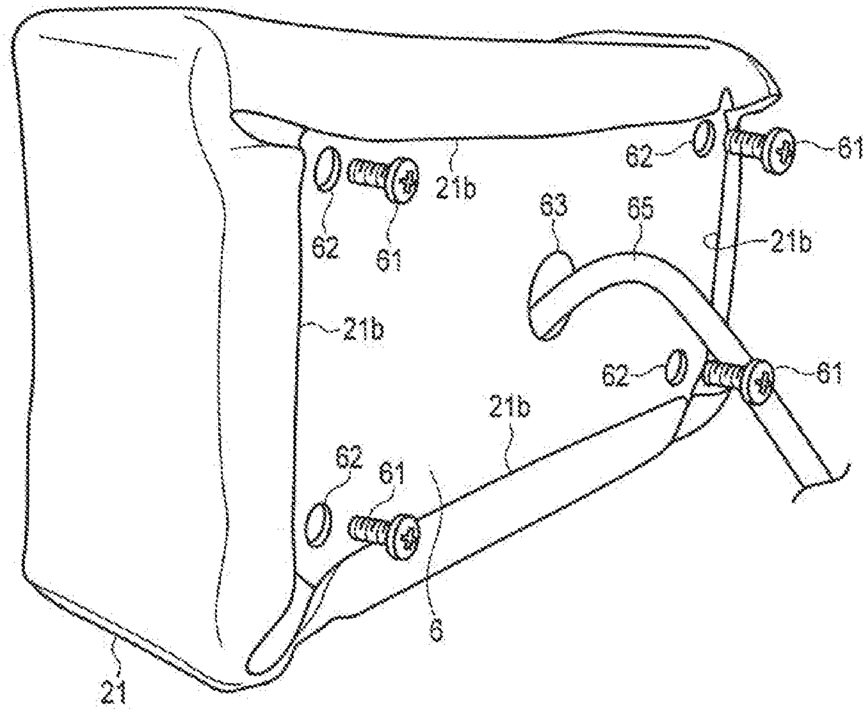
FIG. 4 is a perspective view of the pad main body as viewed from a rear side.

Hereinafter, the kick pad 20 of the present embodiment will be explained with reference to FIGS. 2 to 4. FIG. 2 is an exploded perspective view of the kick pad 20. FIG. 3 is an exploded perspective view of a pad main body 22 of the kick pad 20 shown in FIG. 2. FIG. 4 is a rear perspective view of the pad main body 22 as viewed from the side of a frame 24.

As shown in FIG. 2, the kick pad 20 includes the pad main body 22, the frame 24, and a rear cover 26 from the front side toward the back side. The kick pad 20 of the present embodiment is formed in the shape of a substantially rectangular block including a horizontally long striking surface 21*a*, for compatibility with a twin pedal including two beaters arranged side by side.

As shown in FIG. 3, the pad main body 22 includes a stack 5 (impact-absorbing member) formed by stacking seven substantially-rectangular foamed sheets 2 and two substantially-rectangular sponge sheets 4*a* and 4*b* (sponge layers). The seven foamed sheets 2 are arranged on the front side so as to be stacked on one another, and the two sponge sheets 4*a* and 4*b* are arranged on the back side so as to be stacked on each other. The material, the thickness, the number, the order of arrangement of the foamed sheets 2 and sponge sheets 4*a* and 4*b*, etc. may be suitably varied in accordance with the sound absorption properties and the response properties of the kick pad 20 that are required when the striking surface 21*a* of the pad main body 22 is beaten by the beater 51.

Each of the foamed sheets 2 is a sheet formed by spraying a foaming acrylic agent onto a non-woven fabric and applying heat to make it foam. Of the two sponge sheets 4*a* and 4*b*, the sponge sheet 4*b* on the back side distant from the foamed sheets 2 includes a circular through hole 4*c*, from which a wiring 65 (FIG. 4) of a piezoelectric element 1 (which will be described later) is extracted to the rear side. This sponge sheet 4*b* includes four reception holes 4*d* that receive distal ends of four screws 61 designed to fix the pad main body 22 to the frame 24.

A rectangular metal plate 3, which includes a piezoelectric element 1 at its rear surface 3*a*, is provided between the two sponge sheets 4*a* and 4*b*. The piezoelectric element 1 converts a vibration generated by beating the kick pad 20 with the beater 51 into an electric signal and outputs the electric signal. The metal plate 3 has a size smaller than the foamed sheets 2 and the sponge sheets 4*a* and 4*b*. The metal plate 3 is arranged in such a manner that the piezoelectric element 1 is oriented so as to face the sponge sheet 4*b* on the rear side, as shown in the drawing.

On the further front side of the foamed sheets 2, a protective sheet 2*a* is arranged so as to be stacked thereon. On the further back side of the sponge sheet 4*b*, a rear plate 6 (rear member) is arranged so as to be stacked thereon. The rear plate 6 is formed of an octagonal metal plate with its four corners chamfered, and a through hole 63 that faces a through hole 4*c* of the sponge sheet 4*b* is provided in the middle. The through hole 63 is a hole from which the wiring 65 of the piezoelectric element 1 is extracted. The rear plate 6 includes four screw holes 62, into which the four screws 61 are threadably driven.

On a front surface side of the pad main body 22, there is provided a sheet-like striking surface cover 21 equipped with a function of receiving a strike of the beater 51 and a function of containing the stack 5 on the back surface side to wrap and hold the stack 5. The striking surface cover 21 is formed of, for example, vinyl chloride or urethane. The striking surface cover 21 is provided to wrap and cover the surface on the front side (anterior surface) and all the side surfaces of the stack 5, and is fixedly adhered to the rear surface of the rear plate 6 at the surface (rear surface) on the back side of the stack 5. The material, the thickness, etc. of the striking surface cover 21 is selected to achieve a desired rebound when the beater 51 beats the striking surface 21*a*, which is included in the surface of the striking surface cover 21.

More specifically, the striking surface cover 21 pulls the outer peripheral edge 21*b* outward while applying a tension thereto, and is fixedly adhered to a peripheral edge on the rear surface of the rear plate 6 (see FIG. 4). The adhesion is provided by, for example, a double-faced tape. That is, the striking surface cover 21 is configured in such a manner that its peripheral edge portion is fixedly adhered to the rear plate 6, with the foamed sheets 2 and the sponge sheets 4*a* and 4*b* slightly compressed in their stacking direction. Thus, an anterior edge portion of the pad main body 22, namely, the peripheral edge portion of the striking surface 21*a* is gently curved toward the side surfaces of the pad main body 22.

Referring back to FIG. 2, the frame 24 includes a fixation plate 24*a*, which contacts the rear surface of the pad main body 22 and which is fixedly screwed thereto. The fixation plate 24*a* includes, at a position opposite to the above-described piezoelectric element 1, an opening portion 24*a*-1, from which the wiring 65 of the piezoelectric element 1 is extracted. The fixation plate 24*a* includes four insertion holes 24*a*-2, through which the screws 61 designed to fixedly fasten the pad main body 22 to the surface on the front side of the fixation plate 24*a* are inserted.

A top plate 24*b*, a bottom plate 24*c*, and two side plates 24*d* are continuously and integrally provided at the outer peripheral edge of the fixation plate 24*a*. The top plate 24*b*, the bottom plate 24*c*, and the two side plates 24*d* are bent toward the rear side, so as to be substantially orthogonal to the fixation plate 24*a*.

The pad main body 22 is stacked on the front side of the fixation plate 24*a*, with the outer peripheral edge of the striking surface cover 21 interposed between the surface on the front side of the fixation plate 24*a* and the rear plate 6. The pad main body 22 is fixedly fastened to the fixation plate 24*a* of the frame 24 by means of four screws 61 (FIGS. 3 and 4). The four screws 61 are inserted into the insertion holes 24*a*-2 of the fixation plate 24*a* from inside the frame 24, and are threadably driven into the screw holes 62 of the rear plate 6 of the pad main body 22. By fastening the four screws 61, the outer peripheral edge 21*b* of the striking surface cover 21 is interposed between the rear plate 6 and the fixation plate 24*a*, and the striking surface cover 21 is fixed to the frame 24 as well.

The bottom plate 24*c* of the frame 24 includes, at bent portions between the fixation plate 24*a* and the bottom plate 24*c*, two opening portions 25, through which the upper ends of the two main frames 32 of the stand 30 are inserted. The opening portions 25 are designed to have a size that does not allow the main frame 32 to contact the frame 24 of the kick pad 20 when the kick pad 20 is mounted on the stand 30.

The two side plates 24*d* respectively include attachment holes 27 designed to attach two supporters 10. Also, each of the side plates 24*d* includes an insertion hole 24*d*-1, through which a screw 28 (FIG. 1) designed to fix the corresponding side plate 26*a* of the rear cover 26 is inserted.

The rear cover 26 includes two side plates 26*a*, which are respectively arranged inside the side plates 24*d* of the frame 24. The side plates 26*a* are integrally provided so as to be bent toward the front side from both ends of a rear plate 26*b* as viewed in the horizontal direction.

Each side plate 26*a* has two notches 26*a*-1, which are respectively aligned with the two attachment holes 27 provided in the corresponding side plate 24*d* of the frame 24. The notches 26*a*-1 are designed to have a size (a length and a width) that does not interfere with the supporters 10 fitted into the attachment holes 27. A supporting piece 26*a*-2, which is bent inwards along the top plate 24*b* of the frame 24, is provided at an upper edge of each side plate 26*a*. Each side plate 26*a* has a screw hole 26*a*-3, which is aligned with the insertion hole 24*d*-1 provided in the side plates 24*d* of the frame 24.

When the rear cover 26 is attached to the frame 24, the two side plates 26*a* of the rear cover 26 are stacked on the inside of the two side plates 24*d* of the frame 24, and a screw 28 is threadably driven into the screw hole 26*a*-3 via the insertion hole 24*d*-1. At this time, the rear cover 26 can be attached while the supporters 10 are fitted into the attachment holes 27 of the frame 24. When the rear cover 26 is attached to the frame 24, the supporting piece 26*a*-2 of the rear cover 26 is arranged below the top plate 24*b* of the frame 24.

The rear cover 26 has a configuration in which the side plates 26*a* at both ends of the rear plate 26*b* are bent toward the front side. The rear plate 26*b* is slightly curved so as to bulge out in the middle toward the rear side. A plurality of supporting pieces 26*b*-1 are provided at the lower edge (as shown in the drawing) of the rear plate 26*b*. Each supporting piece 26*b*-1 is bent toward the front side along the bottom plate 24*c* of the frame 24. In each supporting piece 26*b*-1, there is provided a hole through which a screw (not shown in the drawings) designed to fix the supporting piece 26*b*-1 to the bottom plate 24*c* of the frame 24 is inserted.

At an upper end of the rear cover 26, there is provided a U-shaped attachment plate 29*b* designed to attach an LED unit 29*a*. The LED unit 29*a* is fixed to an upper surface of the attachment plate 29*b* by screws (not shown in the drawings). The attachment plate 29*b* is fixedly fastened to the supporting pieces 26*a*-2 of the side plates 26*a* of the rear cover 26 via screws (not shown in the drawings). When the rear cover 26 is attached to the frame 24, the LED unit 29*a* is covered almost entirely by the top plate 24*b*; however, a part of the LED unit 29*a* is exposed from a small gap between the lower surface of the top plate 24*b* of the frame 24 and the upper end of the rear plate 26*b* of the rear cover 26.

The supporter 10 includes an elastic member (not shown in the drawings) arranged between the upper end of the main frame 32 of the stand 30 and the frame 24. The four supporters 10 have the same configuration, and two of the supporters 10 are assigned for the two main frames 32. According to the present embodiment, the kick pad 20 is mounted on the stand 30 via the four supporters 10, instead of directly fixing the kick pad 20 to the stand 30.

As described above, according to the present embodiment, by arranging a plurality of foamed sheets 2 and sponge sheets 4*a* so as to be stacked on one another between the surface (striking surface 21*a*) struck by the beater 51 and the piezoelectric element 1, and wrapping and covering them with the striking surface cover 21 in a tensioned state, the pad main body 22 of the kick pad 20 is configured. That is, the striking surface cover 21 functions not only as a holding cover that holds the stack 5 of the foamed sheets 2 and the sponge sheets 4*a* and 4*b*, but also as a drumhead that constitutes the striking surface 21*a* beaten by the beater 51. Thus, the number of components constituting the kick pad 20 can be reduced, resulting in a lower manufacturing cost of the kick pad 20.

Moreover, according to the present embodiment, since a plurality of foamed sheets 2 and sponge sheets 4*a* are arranged between the piezoelectric element 1 and the striking surface cover 21, the vibration generated when the beater 51 is struck against the striking surface 21*a* can be moderately absorbed and transmitted to the piezoelectric element 1. Thereby, the intensity of vibration generated when the striking surface 21*a* is beaten by the beater 51 can be transmitted to the piezoelectric element 1 with high accuracy and precision, and it is possible to cope with a delicate performance with a subtle difference in intensity.

In this case, by suitably varying the material, the thickness, the number, the order of arrangement, etc. of the foamed sheets 2 and the sponge sheet 4*a* arranged between the striking surface 21*a* and the piezoelectric element 1 and the sponge sheet 4*b* arranged on the rear side of the piezoelectric element 1, the striking sensation of the kick pad 20 can be changed. Basically, by arranging a plurality of foamed sheets 2 and sponge sheets 4*a* between the striking surface 21*a* and the piezoelectric element 1, the impact sound generated when the striking surface 21*a* is beaten with the beater 51 can be absorbed, thus suppressing the problem of noise.

In other words, according to the present embodiment, it is possible to prevent the trouble of producing an unexpectedly loud sound as a result of overreaction of the kick pad 20, even though the player wants to produce a soft sound by depressing the foot pedal 50 with a weak force. On the other hand, with the use of the kick pad 20 of the present embodiment, it is possible to suppress the noise to some degree, even when the foot pedal 50 is depressed with a strong force. That is, the kick pad 20 of the present embodiment can be played with a striking sensation similar to that of an acoustic drum, and the intensity of sound can be delicately expressed.

Furthermore, according to the present embodiment, since the pad main body 22 is configured in such a manner that the striking surface cover 21, which includes, on its front surface, a striking surface 21*a* against which the beater 51 is struck, is fixed to the rear plate 6 in a tensioned state, a natural rebound as can be obtained by a head of an acoustic drum can be obtained when the beater 51 is struck. Thus, with the use of the kick pad 20 of the present embodiment, it is possible to play an electronic drum with almost the same sensation as that of an acoustic drum.

Additional advantages and modifications will readily occur to those skilled in the art. Therefore, the invention in its broader aspects is not limited to the specific details and representative embodiment shown and described herein. Accordingly, various modifications may be made without departing from the spirit or scope of the general inventive concept as defined by the appended claims and their equivalents.

For example, in the above-described embodiment, a case has been explained where foamed sheets and sponge sheets are used as an impact-absorbing member arranged between the piezoelectric element 1 and the striking surface 21*a*, against which the beater 51 is struck; however, the impact-absorbing member is not limited thereto, and other impact-absorbing members such as rubber sheets or an air-filled bag may be used.

Moreover, in the above-described embodiment, a case has been explained where vinyl chloride or urethane is used as the striking surface cover 21 including the striking surface 21*a* of the kick pad 20; however, the striking surface cover 21 is not limited thereto, and other striking surface covers such as a mesh material may be used.

Furthermore, in the above-described embodiment, a case has been explained where the present invention is applied to a kick pad 20 of an electronic drum including a piezoelectric element 1; however, the present invention is not limited thereto, and may be applied to a kick pad not including a piezoelectric element 1. In this case, a tightly-stretched striking surface cover 21 is provided, and a striking sensation and a rebound similar to those of an acoustic drum can be obtained, while ensuring the quietness.

In the above-described embodiment, a case has been explained where the present invention is applied to a kick pad 20 beaten with a beater 51 operated by a foot pedal 50; however, the present invention is not limited thereto, and may be applied to drums other than a bass drum (such as a snare drum and tom-toms), as well as drum pads for practice.

The invention claimed is:

1. A kick pad comprising:

a piezoelectric element that converts a vibration generated by beating with a beater into an electric signal and outputs the electric signal;

an impact-absorbing member arranged between the piezoelectric element and a surface to be beaten by the beater; and a sheet-like striking surface cover that includes a front surface including the surface to be beaten, and that wraps the impact-absorbing member, together with the piezoelectric element.

2. The kick pad according to claim 1, further comprising:

a rear member arranged on a side of the piezoelectric element, opposite to a side on which the impact-absorbing member is arranged, wherein the striking surface cover includes an outer peripheral edge that is fixed to the rear member while being stretched out to compress the impact-absorbing member.

3. The kick pad according to claim 2, wherein the striking surface cover is formed of vinyl chloride or urethane.

4. A kick pad comprising:

an impact-absorbing member; and a sheet-like striking surface cover that includes a front surface including a surface to be beaten, and that wraps the impact-absorbing member.

5. The kick pad according to claim 4, further comprising:

a rear member arranged on a side of the impact-absorbing member, opposite to a side on which the surface to be beaten is arranged, wherein the striking surface cover includes an outer peripheral edge that is fixed to the rear member while being stretched out to compress the impact-absorbing member.

6. The kick pad according to claim 5, wherein the striking surface cover is formed of vinyl chloride or urethane.

7. A drum pad comprising:

an impact-absorbing member; and a sheet-like striking surface cover that includes a front surface including a surface to be beaten, and that wraps the impact-absorbing member.

8. The drum pad according to claim 7, further comprising:

a rear member arranged on a side of the impact-absorbing member, opposite to a side on which the surface to be beaten is arranged, wherein the striking surface cover includes an outer peripheral edge that is fixed to the rear member while being stretched out to compress the impact-absorbing member.

9. The drum pad according to claim 8, wherein the striking surface cover is formed of vinyl chloride or urethane.

* * * * *